(12) United States Patent
Matsui et al.

(10) Patent No.: US 6,989,304 B1
(45) Date of Patent: Jan. 24, 2006

(54) METHOD FOR MANUFACTURING A RUTHENIUM FILM FOR A SEMICONDUCTOR DEVICE

(75) Inventors: Yuichi Matsui, Koganei (JP);
Masahiko Hiratani, Akishima (JP);
Yasuhiro Shimamoto, Hachioji (JP);
Toshihide Nabatame, Tsukuba (JP)

(73) Assignee: Renesas Technology Corp., Tokyo (JP)

( * ) Notice: Subject to any disclaimer, the term of this patent is extended or adjusted under 35 U.S.C. 154(b) by 277 days.

(21) Appl. No.: 10/297,811

(22) PCT Filed: Aug. 11, 2000

(86) PCT No.: PCT/JP00/05399

§ 371 (c)(1),
(2), (4) Date: Dec. 10, 2002

(87) PCT Pub. No.: WO02/15275

PCT Pub. Date: Feb. 21, 2002

(51) Int. Cl.
*H01L 21/8242* (2006.01)

(52) U.S. Cl. .......................................... 438/240; 438/3
(58) Field of Classification Search .................... 438/3, 438/240
See application file for complete search history.

(56) References Cited

U.S. PATENT DOCUMENTS

| | | | |
|---|---|---|---|
| 5,874,364 A * | 2/1999 | Nakabayashi et al. ....... | 438/738 |
| 5,985,759 A * | 11/1999 | Kim et al. ................... | 438/653 |
| 6,002,036 A | 12/1999 | Kadokura | |
| 6,063,705 A * | 5/2000 | Vaartstra ..................... | 438/681 |
| 6,207,232 B1 * | 3/2001 | Kadokura .................... | 427/252 |
| 6,274,195 B1 * | 8/2001 | Rhee et al. ............. | 427/255.31 |
| 6,380,574 B1 * | 4/2002 | Torii et al. ................... | 257/295 |
| 6,440,495 B1 * | 8/2002 | Wade et al. ................. | 427/250 |
| 6,440,795 B1 * | 8/2002 | Harshfield ................... | 438/255 |
| 6,462,368 B2 * | 10/2002 | Torii et al. ................... | 257/295 |
| 6,512,297 B2 * | 1/2003 | Matsuno et al. ............ | 257/768 |
| 2004/0214392 A1 * | 10/2004 | Nabatame et al. .......... | 438/253 |

FOREIGN PATENT DOCUMENTS

| | | |
|---|---|---|
| JP | 9-246214 | 9/1997 |
| JP | 9-312272 | 12/1997 |

(Continued)

OTHER PUBLICATIONS

Machine translation of JP-11-340435, filed in IDS, Tomonori et al. Dec. 1999.*

Japan Journal Applied Physics, vol. 38, 1999, pp. L1134-L1136.

(Continued)

*Primary Examiner*—Jennifer Kennedy
(74) *Attorney, Agent, or Firm*—Mattingly, Stanger, Malur & Brundidge, P.C.

(57) ABSTRACT

In the method of manufacturing a semiconductor device according to this invention, when an interlayer insulating film is fabricated such that an opening is cylindrical and low-pressure and long-throw sputtering is used for forming a lower ruthenium electrode, a ruthenium film can be deposited on the side wall of a deep hole. Further, after removing the ruthenium film deposited on the upper surface of the interlayer insulating film, a dielectric material comprising, for example, a tantalum pentoxide film is deposited. Successively, an upper ruthenium electrode is deposited using, for example, $Ru(EtCp)_2$ as a starting material and by chemical vapor deposition of conveying the starting material by bubbling. The upper ruthenium electrode can be formed with good coverage by using conditions that the deposition rate of the ruthenium film depends on the formation temperature (reaction controlling condition). This invention can provide a fine concave type capacitor having a ruthenium electrode.

20 Claims, 9 Drawing Sheets

1 --- PLUG
2 --- PLUG PORTION INTERLAYER INSULATING FILM
3 --- CAPACITOR PORTION INTERLAYER INSULATING FILM
4 --- LOWER RUTHENIUM ELECTRODE FORMED BY LOW-PRESSURE AND LONG-THROW SPUTTERING METHOD
5 --- OXIDE DIELECTRIC FILM
7 --- RUTHENIUM SEED LAYER FORMED BY BUBBLING CVD METHOD
8 --- UPPER RUTHENIUM ELECTRODE FORMED BY SOLVENT CONVEYANCE CVD METHOD

FOREIGN PATENT DOCUMENTS

| | | |
|---|---|---|
| JP | 10-204630 | 8/1998 |
| JP | 11-35589 | 2/1999 |
| JP | 11-317377 | 11/1999 |
| JP | 11-340435 | 12/1999 |
| JP | 11-354751 | 12/1999 |
| JP | 2000-156483 | 6/2000 |
| JP | 2000-208744 | 7/2000 |
| JP | 2001-210802 | 8/2001 |
| JP | 2002-33462 | 1/2002 |

OTHER PUBLICATIONS

"Ruthenium Films Prepared by Liquid Source Chemical Vapor Deposition Using Bis-(Ethylcyclopentadienyl) Ruthenium".

Dai 54Kai Handoutai Shuueski Kairo Gujitsu Symposium Kouen Ronbunshuu, Nov. 6, 1998, pp. 49-53.

"Vapor Pressure and Properties of $Ru(E+Co)_2$ for Liquid Source Ru-CVD".

* cited by examiner

1 ··· PLUG
2 ··· PLUG PORTION INTERLAYER INSULATING FILM
3 ··· CAPACITOR PORTION INTERLAYER INSULATING FILM
4 ··· LOWER RUTHENIUM ELECTRODE FORMED BY LOW-PRESSURE AND LONG-THROW SPUTTERING METHOD
5 ··· OXIDE DIELECTRIC FILM
6 ··· UPPER RUTHENIUM ELECTRODE FORMED BY BUBBLING CVD METHOD

1 ··· PLUG
2 ··· PLUG PORTION INTERLAYER INSULATING FILM
3 ··· CAPACITOR PORTION INTERLAYER INSULATING FILM
4 ··· LOWER RUTHENIUM ELECTRODE FORMED BY LOW-PRESSURE AND LONG-THROW SPUTTERING METHOD
5 ··· OXIDE DIELECTRIC FILM
7 ··· RUTHENIUM SEED LAYER FORMED BY BUBBLING CVD METHOD
8 ··· UPPER RUTHENIUM ELECTRODE FORMED BY SOLVENT CONVEYANCE CVD METHOD

1 ··· PLUG
2 ··· PLUG PORTION INTERLAYER INSULATING FILM
3 ··· CAPACITOR PORTION INTERLAYER INSULATING FILM
5 ··· OXIDE DIELECTRIC FILM
6 ··· UPPER RUTHENIUM ELECTRODE FORMED BY BUBBLING CVD METHOD
9 ··· RUTHENIUM SEED LAYER FORMED BY LOW-PRESSURE AND LONG-THROW SPUTTERING METHOD
10 ··· LOWER RUTHENIUM ELECTRODE BY SOLVENT CONVEYANCE CVD METHOD

FIG. 4

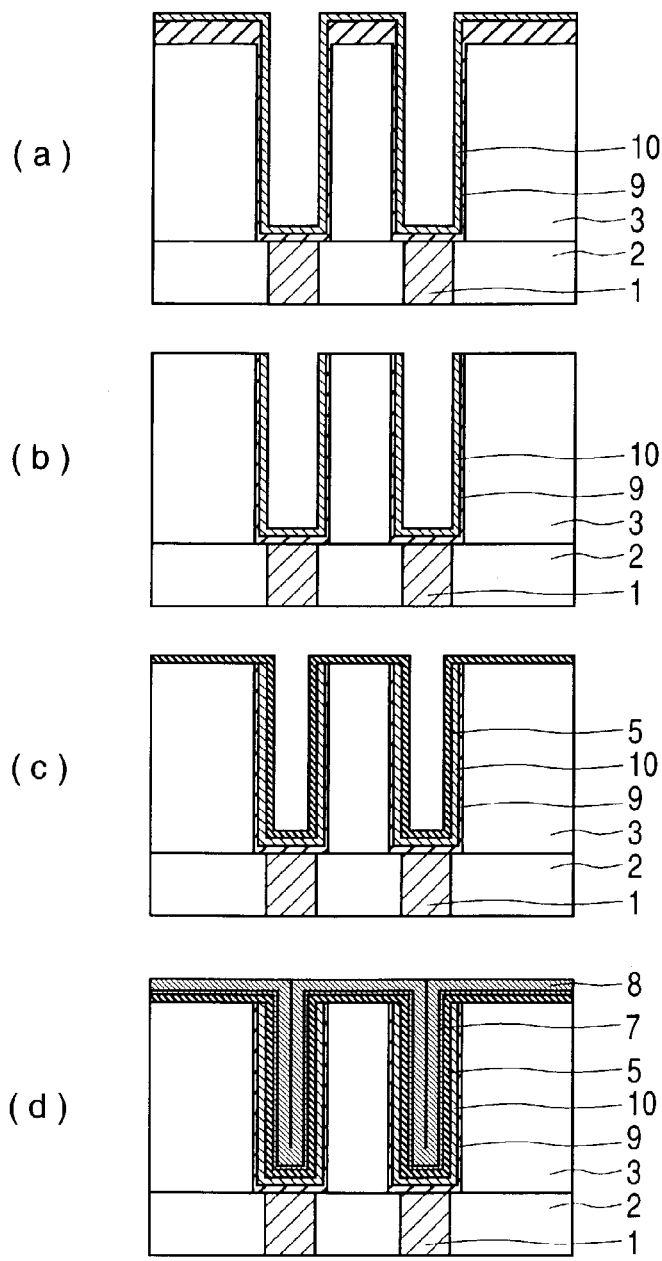

1 ⋯ PLUG
2 ⋯ PLUG PORTION INTERLAYER INSULATING FILM
3 ⋯ CAPACITOR PORTION INTERLAYER INSULATING FILM
5 ⋯ OXIDE DIELECTRIC FILM
7 ⋯ RUTHENIUM SEED LAYER FORMED BY BUBBLING CVD METHOD
8 ⋯ UPPER RUTHENIUM ELECTRODE FORMED BY SOLVENT CONVEYANCE CVD METHOD
9 ⋯ RUTHENIUM SEED LAYER FORMED BY LOW-PRESSURE AND LONG-THROW SPUTTERING METHOD
10 ⋯ LOWER RUTHENIUM ELECTRODE BY SOLVENT CONVEYANCE CVD METHOD

FIG. 6

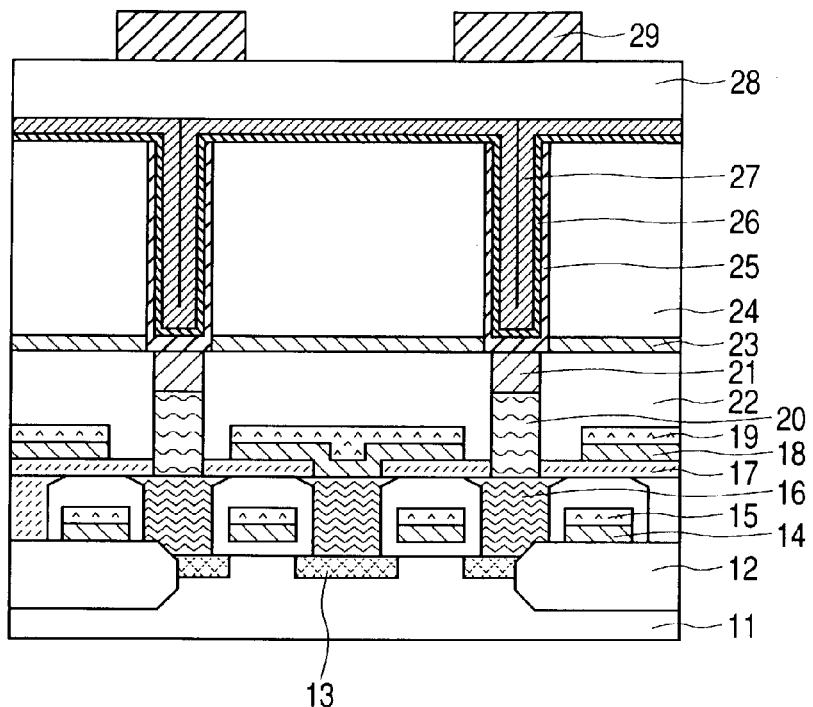

11 ⋯ SUBSTRATE (Si)
12 ⋯ DEVICE ISOLATION (SiO2)
13 ⋯ DIFFUSED LAYER
14 ⋯ WORD LINE (poly-Si)
15 ⋯ WORD LINE (WSi2)
16 ⋯ FIRST PLUG (poly-Si)
17 ⋯ BARRIER LAYER (Si3N4)
18 ⋯ BIT LINE (poly-Si)
19 ⋯ BIT LINE (WSi2)
20 ⋯ SECOND PLUG (poly-Si)
21 ⋯ BARRIER (TiN)
22 ⋯ PLUG PORTION INTERLAYER INSULATING FILM (SiO2)
23 ⋯ INTERLAYER INSULATING FILM (Si3N4)
24 ⋯ CAPACITOR PORTION INTERLAYER INSULATING FILM (SiO2)
25 ⋯ LOWER ELECTRODE (Ru BY LOW-PRESSURE AND LONG-THROW SPUTTERING METHOD)
26 ⋯ OXIDE DIELECTRIC MATERIAL (Ta2O5)
27 ⋯ UPPER ELECTRODE (Ru BY BUBBLING CVD METHOD)
28 ⋯ WIRING PORTION INTERLAYER INSULATING FILM (SiO2)
29 ⋯ SECOND WIRING LAYER (W)

(a)

(b)

(c)

(d)

1 ··· PLUG
2 ··· PLUG PORTION INTERLAYER INSULATING FILM
3 ··· CAPACITOR PORTION INTERLAYER INSULATING FILM
4 ··· LOWER RUTHENIUM ELECTRODE FORMED BY LOW-PRESSURE AND LONG-THROW SPUTTERING METHOD
5 ··· OXIDE DIELECTRIC FILM
30 ··· UPPER RUTHENIUM FORMED BY LOW-PRESSURE AND LONG-THROW SPUTTERING METHOD

METHOD FOR MANUFACTURING A RUTHENIUM FILM FOR A SEMICONDUCTOR DEVICE

TECHNICAL FIELD

The present invention concerns a semiconductor device using ruthenium as an electrode for an oxide dielectric capacitor used in a memory portion, for example, of a dynamic random access memory (DRAM), as well as a manufacturing method therefor.

BACKGROUND ART

In a semiconductor device having DRAM or the like, high degree of integration is attained by the reduction of a memory cell area. This means that the area occupied by a capacitor portion is inevitably decreased. With all that, for preventing soft errors, a predetermined quantity of stored charges required for reading of a memory has to be ensured. That is, for higher integration of a semiconductor device, it is for a means that increases the quantity of stored charges for unit area.

One of the means described above can include application of an oxide dielectric material with high relative dielectric constant to a capacitor insulating film. At present, silicon oxide films ($SiO_2$ film, relative dielectric constant: 3.8) and silicon nitride films ($Si_3N_4$ film, relative dielectric constant: 7–8) have been used as the capacitor dielectric film at present. Instead of them, it has now been studied on the use of tantalum pentoxide films ($Ta_2O_5$ film, relative dielectric constant: 20–25) or oxide dielectric materials having a relative dielectric constant of 100 or more, for example, strontium titanate [$SrTiO_3$(STO)], barium strontium titanate [(Ba, Sr)$TiO_3${BST}], lead titanate zirconate [Pb(Zr, Ti)$O_3${PZT}] and bismuth type layerous ferroelectric materials. Among them, PZT or bismuth type layerous ferroelectric material is applicable also to ferroelectric memories utilizing the ferroelectric property thereof. However, in a memory of a Gbit scale, quantity of stored charges required for reading is insufficient even when an oxide dielectric material of high relative dielectric constant is adopted as the capacitor dielectric film. Accordingly, it is necessary to make the capacitor portion into a three-dimensional form to substantially increase the capacitor area.

The oxide dielectric material requires film formation or post-annealing at a high temperature of at least 400° C. to 700° C. and in an oxidizing atmosphere for improving the electrical characteristics thereof. In this case, when a lower electrode is oxidized by oxygen in the atmosphere, a dielectric film of lower dielectric constant than a capacitor dielectric film is formed to result in substantial decrease in the capacitance of the capacitor. Further, when a barrier layer or a plug situating below the lower electrode is oxidized, electrical conductivity between a transistor and a capacitor is lost. Then, platinum (Pt) which is relatively stable to an atmosphere at high temperature and to oxidizing atmosphere, or ruthenium (Ru) or iridium (Ir) keeping conductivity even when the oxide is formed has been studied as an effective candidate for the lower electrode. Among them, ruthenium which is particularly excellent in fine fabricability is a most preferred material as a lower electrode of an oxide dielectric material. Further, since the electric characteristic of a capacitor depends on the dielectric material/electrode interface characteristic, it is necessary to use the same material as the lower electrode for the upper electrode.

In summary, in a memory of a Gbit scale, since the area that capacitor can occupy is small, the quantity of stored charges required for reading is possibly insufficient even when an oxide dielectric material of high relative dielectric constant is used. In view of the above, it is necessary to make the capacitor into a three-dimensional form in order to increase substantial capacitor area. Specifically, it requires steps of depositing the lower electrode described above on a structure which has been previously fabricated into a three-dimensional structure and then forming an oxide dielectric material and an upper electrode.

As a method of forming the lower electrode of the three-dimensional structure described above, the formation method by the prior art is to be explained with reference to the drawings and, further, problems or subjects are pointed out.

A method of fabricating a deep hole from the surface of a silicon oxide film which is ease for fine fabrication, then depositing a lower ruthenium electrode by a sputtering method thereby forming a three-dimensional structure is to be described with reference to FIG. 9. All the drawings represent cross sections.

At first, on plugs 1 comprising, for example, titanium nitride and a plug portion interlayer insulating film 2 comprising, for example, a silicon oxide film, is deposited a capacitor portion interlayer insulating film 3 of 700 nm thickness comprising, for example, a silicon oxide film. Then, the capacitor portion interlayer insulating film 3 is fabricated to the surface of the plug portion interlayer insulating film 2 such that an opening has a circular cylindrical shape, elliptic cylindrical shape, or a rectangular shape by using a well-known photolithographic method and a dry etching method. Assuming the width of the deep hole as 130 nm, the aspect ratio of the deep hole (height/width) is 700 nm/130 nm, that is, about 5.4. After forming the deep hole, a lower ruthenium electrode is deposited. In this step, when existent sputtering of poor step coverage is used, no ruthenium film is deposited on the side wall of the deep hole. Therefore, it is necessary to use a formation method of excellent step coverage. This subject can be solved by using a method of sputtering with low pressure and substrate to target distances (long-throw) although the details are to be described later. Then, the lower ruthenium electrode 4 is deposited by the low-pressure and long-throw sputtering [FIG. 9(a)].

In this case, for depositing ruthenium to 20 nm thickness on the side wall of the opening, it is necessary to deposit ruthenium of about 300 nm to the upper surface. Since sputtering particles have high straight forwarding property, the thickness of ruthenium deposited at the bottom of the deep hole is 40 nm which is about twice the thickness on the side wall.

Then, for separating adjacent capacitors electrically, when the lower electrode deposited on the upper surface of the capacitor portion interlayer insulating film 3 is removed by sputter etching, a lower electrode having a three-dimensional structure can be formed [FIG. 9(b)].

Subsequently, an oxide dielectric film 5 comprising, for example, tantalum pentoxide of about 10 nm thickness is deposited by chemical vapor deposition [FIG. 9(c)].

Then, the height of the deep hole is decreased by so much as the thickness of the ruthenium at the bottom (40 nm) and the thickness of the dielectric material (10 nm) into about 650 nm. On the other hand, the width of the deep hole is decreased by so much as twice of the ruthenium film thickness on the side wall (20 nm) and twice of the dielectric film thickness (10 nm) into about 70 nm. Accordingly, the aspect ratio is 70 nm/650 nm, that is, about 9.3 upon forming the upper electrode and it increases to about 1.7 times when the lower electrode is formed. Therefore, even when the upper electrode 30 comprising, for example, ruthenium is deposited by the low-pressure and long-throw sputtering, it causes an additional subject that the ruthenium film is deposited on the side wall of the deep hole [FIG. 9(d)].

In summary, in the step of manufacturing a concave shape capacitor, no lower ruthenium electrode can be formed by the existent sputtering method. In addition, the aspect ratio increases further upon forming the upper electrode. Therefore, it has been demanded for a method of forming a ruthenium electrode of high coverage.

DISCLOSURE OF INVENTION

At first, a method of forming a lower electrode is to be described.

As has been described above, no ruthenium film is deposited on the side wall of a deep hole by the existent sputtering method. However, it has been found that the ruthenium film can be deposited also on the side wall of the deep hole by using low-pressure and long-throw sputtering. This is a method of taking a long distance between a target and a substrate and lowering the pressure of a sputtering atmosphere thereby enhancing the straight forwarding property of sputtering particles. By the method, the sputtered particles can reach the inside of the deep hole.

Further, as the method of enhancing the straight forwarding property of the sputtering particles, similar effect can be obtained, not restricted to the low-pressure and long-throw sputtering, also by collimated sputtering of locating a collimator between a target and a substrate or an ionized sputtering of ionizing sputtering particles and unifying the forwarding direction by an electric field.

The ruthenium film can be deposited with good coverage also by using chemical vapor deposition to be described later but, since the ruthenium formed by the chemical vapor deposition has poor adhesion with the underlying $SiO_2$, peeling occurs when it is used as a lower electrode of a capacitor.

On the other hand, in a case of the low-pressure and long-throw sputtering, since sputtering particles have high kinetic energy, adhesion between the lower ruthenium electrode and $SiO_2$ can be increased due to collision against the underlying layer.

In summary, when sputtering of enhancing the straight forwarding property of particles such as the low-pressure and long-throw sputtering is used, the formation of the lower ruthenium electrode, the ruthenium film can be deposited on the side wall of the deep hole and, in addition, higher adhesion compared with the ruthenium film formed by the chemical vapor deposition can be obtained.

However, since the aspect ratio is further increased in the formation of the upper electrode, no ruthenium film can be deposited on the side wall of the deep hole even when the low-pressure and long-throw sputtering is used. Therefore, a method of forming further higher coverage is necessary for the formation of the upper electrode.

In order to solve the subject, a technique of forming the ruthenium electrode by the chemical vapor deposition has been studied. As the starting material, $Ru(EtCp)_2$[Ru$(C_2H_5C_5H_4)_2$: bis (ethylcyclopentadienyl) ruthenium] which is liquid at a room temperature and atmospheric pressure is used for instance.

A method of conveying the starting material can include a method of bubbling a liquid starting material by an argon gas or the like (bubbling method) and a method of driving out a starting material from a container by the pressure of an argon gas or the like (liquid conveyance method).

A method of conveying $Ru(EtCp)_2$ by the bubbling or liquid conveyance method and forming a ruthenium film by the chemical vapor deposition is described in, for example, Japanese Patent Laid-Open No. H11-035589. However, it does not disclose means capable of obtaining good step coverage. Further, while the liquid conveyance method is described also in Japanese Journal of Applied Physics, Vol. 38 (1999) pp. L1134–L1136, it does not disclose a means capable of obtaining good step coverage like the patent described above.

Further, it may be considered a method of conveying the starting material dissolved in a solvent (solvent conveyance method). This is a method of dissolving the starting material $Ru(EtCp)_2$ into a tetrahydrofuran (THF, $C_4H_8O$), for example, and driving out the starting material from the container by the pressure of an argon gas or the like. For promoting the decomposition of the starting material, the starting material and oxygen are usually mixed just before the film deposition chamber and film formation is conducted in an oxidizing atmosphere.

Then, the step coverage was evaluated while changing the oxygen partial pressure and the formation temperature. As a result, it has been found that when the ruthenium film is formed under the condition that the forming rate thereto constitutes the reaction controlling (condition of low temperature and low oxygen partial pressure) in the bubbling or the liquid conveyance method, a step coverage of about 100% can be obtained. On the other hand, in the solvent conveyance method, since it is necessary to decompose also the solvent in addition to the starting material, more oxygen gas is required compared with the bubbling. Therefore, difference of the oxygen concentration increases between the upper surface and the bottom surface of the hole structure to worsen the step coverage. However, it has been found that when a seed layer of ruthenium is previously formed, a step coverage of about 100% can be obtained under the condition of low oxygen partial pressure. Details for the forming conditions are to be described later.

In summary, the chemical vapor deposition using an organic ruthenium compound as the starting material is classified into a method of conveying the starting material (bubbling or liquid conveyance method) and a method of conveying the starting material dissolved in a solvent (solvent conveyance method), in which a formation conditions capable of obtaining good coverage are present in the former but a ruthenium seed layer is necessary in the latter.

A step of forming a concave type capacitor using the technique described above has been devised. This is to be described below in the order of (1) a method of forming a lower ruthenium electrode by low-pressure and long-throw sputtering, and forming an upper ruthenium electrode by chemical vapor deposition of conveying the starting material, (2) a method of forming an ultra-thin ruthenium seed layer on a dielectric film by chemical vapor deposition of conveying the starting material, and forming an upper ruthenium electrode by chemical vapor deposition of conveying the starting material dissolved in a solvent by a chemical vapor deposition, (3) a method of forming a ultra-thin ruthenium seed layer by sputtering and forming a lower ruthenium electrode by chemical vapor deposition, (4) desired formation conditions when forming the seed layer and the electrode and (5) desired apparatus structure.

(1) At first, description is to be made for a step of forming a lower ruthenium electrode by low-pressure and long-throw sputtering and forming an upper ruthenium electrode by chemical vapor deposition of conveying a starting material.

After fabricating an interlayer insulating film such that an opening has a circular cylindrical, elliptic cylindrical or square cylindrical shape, a lower ruthenium electrode is deposited by low-pressure and long-throw sputtering over the entire surface such that the film thickness on the side wall of the deep hole is about 20 nm. Since the lower electrode formed by sputtering has high adhesion with the underlying portion, peeling can be suppressed.

Then, for separating adjacent capacitors electrically, the ruthenium film deposited on the upper surface of the interlayer insulating film is removed by chemical mechanical polishing or sputter etching. Then, heat treatment may be applied for sintering the ruthenium electrode.

After the steps described above, a dielectric material comprising, for example, tantalum pentoxide film is deposited.

Successively, an upper ruthenium electrode is deposited by using, for example, $Ru(EtCp)_2$ as a starting material by chemical vapor deposition of conveying the starting material by bubbling. The upper ruthenium electrode can be formed at good coverage by using the condition where the deposition rate of the ruthenium film depends on the formation temperature (condition for reaction controlling).

A capacitor of a desired concave structure can be formed by using the steps described above. It will be apparent that the chemical vapor deposition by liquid conveyance may be used instead of the chemical vapor deposition conveying the starting material by the bubbling described above.

(2) Then, description is to be made for the step of forming a ultra-thin ruthenium seed layer by chemical vapor deposition of conveying a starting material and forming an upper ruthenium electrode by chemical vapor deposition of conveying the starting material dissolved in a solvent.

After fabricating an interlayer insulating film such that an opening forms a circular cylindrical shape, elliptic cylindrical or square cylindrical, a lower ruthenium electrode is deposited by low-pressure and long-throw sputtering over the entire surface such that the film thickness on the side wall of the deep hole is about 20 nm. Since the lower electrode formed by sputtering has high adhesion with the underlying portion, peeling can be suppressed.

Then, for separating adjacent capacitors electrically, the ruthenium film deposited on the upper surface of the interlayer insulating film is removed by chemical mechanical polishing or sputter etching. Then, heat treatment may be applied for sintering the ruthenium electrode.

After the steps described above, a dielectric material comprising, for example, a tantalum pentoxide film is deposited.

Then, a step of depositing an upper ruthenium electrode is necessary. The step of using, for example, $Ru(EtCp)_2$ as the starting material and depositing the upper ruthenium electrode by chemical vapor deposition using the bubbling or liquid conveyance method has been described previously. However, the method described above, since the methods described above convey the starting material directly, they involve a problem that the thickness of the ruthenium film tends to fluctuates depending on the temperature of the starting material container or pipelines. Further, when the viscosity of the starting material is high, the starting material may possibly cause clogging to valves or pipeline portions. Accordingly, as a method capable of stably supplying the starting material, the solvent conveyance method is used preferably. The solvent conveying method also has a merit capable of using a solid organic compound starting material. However, a ruthenium seed layer is necessary for obtaining good coverage as described above. Then, after the deposition of the dielectric material, a ultra-thin ruthenium film is deposited over the entire surface by chemical vapor deposition of conveying the starting material (bubbling or liquid conveyance method). This is referred to as a seed layer. The seed layer functions well even when it is a discontinuous film of about 1 nm thickness. When the thickness of the seed layer fluctuates, the function does not change. Further, since the film thickness is thin, the amount of the starting material to be used can be reduced. Accordingly, the problem that the film thickness tends to fluctuate and the starting material may possibly cause clogging in the valve or the like in the bubbling or liquid conveyance method is negligible. An upper ruthenium electrode of a desired film thickness is deposited on the seed layer by chemical vapor deposition of using the solvent conveyance method. So long as it is on the seed layer, an upper ruthenium of high coverage can be formed also by the solvent conveyance method.

A capacitor of a desired concave structure can be formed by the steps described above.

(3) Then, description is to be made for the step of forming a ultra-thin ruthenium seed layer by sputtering and forming a lower ruthenium electrode by the chemical vapor deposition.

The interlayer insulating film is fabricated such that an opening has a circular cylindrical, elliptic cylindrical or square cylindrical shape.

Then, a step of forming the lower electrode is necessary. The method of depositing the lower ruthenium electrode by the low-pressure and long-throw sputtering over the entire surface such that the film thickness on the side wall of the deep hole is about 20 nm is as has been described previously. In this case, it is necessary to deposit ruthenium of about 300 nm on the upper surface of the interlayer insulating film. For separating adjacent capacitors electrically, it is necessary to remove the ruthenium film on the upper surface by chemical mechanical polishing or sputter etching and it is preferred that the ruthenium film is thinner in this step. For this purpose, a seed layer of ruthenium may be formed at first by the low-pressure and long-throw sputtering and then a lower electrode may be deposited by the chemical vapor deposition of excellent coverage. Since the seed layer on the side wall functions effectively, even if it is a discontinuous film of about 1 nm thickness, the film thickness of ruthenium deposited on the upper surface portion may be of about 15 nm. In the formation of the lower electrode by the chemical vapor deposition, the film thickness of ruthenium at the upper surface is about 20 nm which is substantially identical with that for the side wall. That is, according to this method, the film thickness of the ruthenium at the upper surface to be removed is about 35 nm which can be decreased to ⅛ or less compared with 300 nm in the method of forming the lower electrode by the lower pressure and long-throw sputtering. Further, when the seed layer is formed by the low-pressure and long-throw sputtering, since adhesion with the underlying portion is high, peeling can be suppressed. For the chemical vapor deposition forming the lower electrode, either a method of conveying the starting material (bubbling conveyance, liquid conveyance) or a method of conveying a starting material dissolved in a solvent (solvent conveyance) may be used. A seed layer of ruthenium is formed by the low-pressure and long-throw sputtering and, successively, the lower ruthenium electrode is formed by the chemical vapor deposition.

Then, the ruthenium film deposited on the upper surface of the interlayer insulating film is removed by chemical mechanical polishing or sputter etching. In this step, a heat treatment may be applied for sintering the ruthenium electrode.

After the steps described above, a dielectric material comprising, for example, a tantalum pentoxide film is deposited. Successively, when the upper ruthenium electrode is deposited by using $Ru(EtCp)_2$ as the starting material and by the chemical vapor deposition of conveying the starting material by bubbling, a capacitor of a desired concave structure can be formed.

As is apparent, the chemical vapor deposition by the liquid conveyance may also be used instead of the chemical vapor deposition of conveying the starting material by bubbling. Further, an ultra-thin ruthenium seed film may be deposited by the bubbling or liquid conveyance method and, successively, the upper ruthenium electrode of a desired film thickness may be formed by the solvent conveyance method.

(4) Then, description is to be made for desired forming conditions when the seed layer and the electrode are formed.

The conditions for forming the seed layer or the electrode by the bubbling conveyance method are to be described with reference to FIG. 7. A ruthenium film was formed by bubbling using $Ru(EtCp)_2$ as the starting material into a hole of 300 nm diameter and 700 nm depth to evaluate step coverage. The horizontal axis expresses the formation temperature, while the vertical axis expresses a step coverage rate defined by the ratio of the film thickness on the side wall near the bottom to that on the top surface.

The coverage rate reaches 100% at a formation temperature of 230° C. or lower at an oxygen ratio during film formation of 1.3%, but it decreases abruptly along with increase in the formation temperature and lowers approximately to 30% at 270° C. When the oxygen ratio increases to 25%, the step coverage decreases generally by about 20%. Accordingly, when the ruthenium seed layer is formed by bubbling, it is desirable that the oxygen concentration is below 25% and the lower limit for the oxygen density desirably exceeds 0.1% which is necessary for the decomposition of the starting material. Further, the formation temperature is preferably below 230° C. but the lower limit of the formation temperature preferably exceeds 200° C. which is necessary for decomposition of the starting material. However, the critical conditions for the formation temperature and the oxygen pressure vary depending on the structure of the apparatus. Generally, the film formation temperature can not be determined generally due to the difference of the heating method of the wafer and the temperature measuring method or the like. The pressure greatly depends on the way of flow of the gas and the positional relation between the wafer and the gas flow in the apparatus. However, when the entire pressure in the apparatus exceeds 10 Torr, a gas phase reaction is started. On the other hand, the film forming rate is abruptly decreased at 0.1 Torr or lower. So that the temperature is desirably between them. Further, also for the conditions of forming the seed layer or the electrode by the liquid conveyance method, they are desirably within the same range as that for the bubbling.

The conditions for forming the electrode by the solvent conveyance method is to be described with reference to FIG. 8. After forming a ruthenium seed layer by low-pressure and long-throw sputtering to a hole of 300 nm diameter and 700 nm depth, a ruthenium film was formed by a solvent conveyance method of dissolving $Ru(EtCp)_2$ into a THF solvent to evaluate a step coverage. The horizontal axis expresses the formation temperature and the vertical axis expresses the the step coverage. At the oxygen ratio in the film formation of 10%, the step coverage reaches 100% irrespective of the formation temperature. As the oxygen concentration increases to 30% and 70%, the coverage decreases abruptly. Accordingly, when the ruthenium electrode is formed by the solvent conveyance, it is desirable that the oxygen concentration is below 30% but the lower limit for the oxygen concentration desirably exceeds 1% which is necessary for the decomposition of the starting material. Further, the formation temperature is desirably below 450° C. but the lower limit for the formation temperature desirably exceeds 250° C. which is necessary for the decomposition of the starting material. However, as has been described above, the critical conditions can not be decided generally. The pressure is preferably between 0.1 Torr and 10 Torr like in the bubbling method.

(5) Finally, description is to be made for a desired apparatus structure.

For the method of forming the seed layer by the bubbling and the method of forming the electrode by the solvent conveyance method, only the method of supplying the starting material is different and the structure for the film deposition chamber may be identical for both of them. Accordingly, it is desirable for an apparatus having two conveyance systems for the bubbling and the solvent conveyance in one film deposition chamber. A concrete constitution of the apparatus is to be explained with reference to FIG. 5. One of the conveyance systems is for use in the bubbling. In a starting material container, a starting material not dissolved in a solvent is charged. The starting material is conveyed by the bubbling using an argon (Ar) gas controlled with the flow rate by a mass flow controller (MFC) as a carrier gas, and mixed with an oxygen ($O_2$) gas as a reaction gas before the film deposition chamber. The starting material and oxygen are supplied by way of a distributor onto a wafer heated by a heater. A ruthenium seed layer is formed by using a starting material supply system by the bubbling. The other of the conveyance systems is for use in the solvent conveyance method. A starting material dissolved in a solvent is charged in a starting material container. A starting material controlled with a flow rate by a liquid mass flow meter is vaporized in a vaporizer. In the same manner as in the bubbling, it is mixed with an oxygen gas as a reaction gas before the film deposition chamber, and the starting material and oxygen are supplied by way of a distributor onto a wafer heated by a heater. A ruthenium electrode is formed by using the starting material supply system by the solvent conveyance method. Since the seed layer and the electrode can be formed continuously by using the apparatus, the performance of the seed layer can be utilized to the utmost degree.

It will be apparent that the wafer may be taken out of the film deposition chamber after forming the seed layer and, after removal of the ruthenium film on the upper planar surface of the interlayer insulating film and sintering of the seed layer, it may be returned again into the film deposition chamber to form the electrode.

Further, a conveyance system for use in the liquid conveyance method may also be used instead of the conveyance system for use in the bubbling. In this case, a starting material controlled with the flow rate by the liquid mass flow meter is vaporized by an vaporizer, mixed with an oxygen gas as a reaction gas before the film deposition chamber, and the starting material and oxygen are supplied by way of a distributor onto a wafer heated by a heater.

BRIEF DESCRIPTION OF DRAWINGS

FIG. 4 is a vertical cross sectional view for explaining Embodiment 4 according to this invention.

FIG. 6 is a vertical cross sectional view for explaining Embodiment 5 according to this invention.

BEST MODE FOR CARRYING OUT THE INVENTION

Embodiment 1

Figure 1:
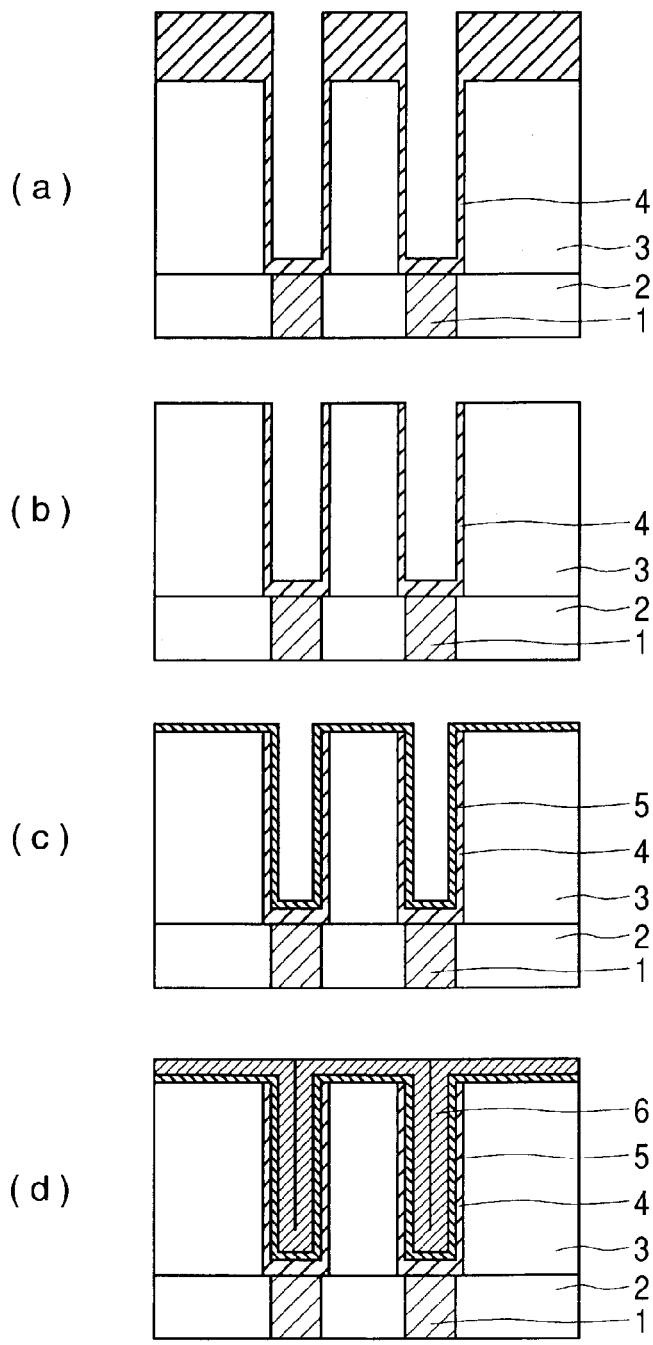
FIG. 1 is a vertical cross sectional view for explaining Embodiment 1 according to this invention.

Embodiment 1 according to this invention is to be described with reference to FIG. 1. In this embodiment, a lower ruthenium electrode is formed by low-pressure and long-throw sputtering and an upper ruthenium electrode is formed by chemical vapor deposition of conveying a starting material.

At first, on plugs 1 comprising titanium nitride and a plug portion interlayer insulating film 2 comprising $SiO_2$, a capacitor portion interlayer insulating film 3 of 700 nm thickness comprising $SiO_2$ was deposited by plasma CVD using a mono-silane gas as a starting material.

Then, resist was coated and developed by well-known photolithography and the capacitor portion interlayer insulating film 3 was fabricated by dry etching as far as the surface of the plug 1 using the resist as a mask. The fabrication was applied such that the opening had an elliptic cylindrical shape, and the opening is utilized as a lower electrode.

After removing the resist, a lower ruthenium electrode 4 was deposited over the entire surface by the low-pressure and long-throw sputtering [FIG. 1(a)]. The deposition conditions for the lower ruthenium electrode were at a temperature of 300° C., at an incident power of 2 kW and a pressure of 0.1 Pa. Further, the distance between the target and the substrate was set to 170 mm. The film thickness was about 20 nm on the side wall of the deep hole, about 40 nm in the hole bottom and about 300 nm in the planar portion of the upper surface.

Then, for electrically separating the adjacent capacitors, the ruthenium film deposited on the upper surface of the interlayer insulating film was removed by chemical mechanical polishing or sputter etching [FIG. 1(b)]. Then, when the ruthenium film is removed, it is preferred to previously form a stopper such as a silicon nitride film to the surface of the capacitor portion interlayer insulating film in advance. The stopper may be removed after the removal of the ruthenium film or may be left as it is. Further, it is desirable to bury a silicon oxide film or resist in a concave portion for preventing particles from dropping to the concave portion of the capacitor portion interlayer insulating film. It is necessary that the silicon oxide film or the resist be removed before forming the lower electrode.

In this process, for preventing the lower ruthenium electrode from deformation by the post-annealing, it is desirable to sinter the lower ruthenium electrode by a heat treatment. Specifically, a heat treatment at 700° C. for 1 min may be conducted in a inert atmosphere, for example, in argon.

The heat treatment temperature is preferably higher than the heat treatment temperature for crystallization of a dielectric oxide film.

Then, an oxide dielectric material 5 comprising a tantalum pentoxide film was deposited by chemical vapor deposition [FIG. 1(c)]. $Ta(OC_2H_5)_5$ (pentaethoxy tantalum) used as the Ta starting material was conveyed by bubbling using Ar as a carrier gas and mixed with oxygen just before the film deposition chamber. The deposition temperature was 400° C., the pressure was 0.5 Torr and the film thickness was 10 nm. After deposition of the tantalum pentoxide film, a heat treatment was applied for promoting crystallization of the tantalum pentoxide film. At first, after conducting a heat treatment for crystallization in a nitrogen gas flow at 650° C. for 120 sec, an oxidizing heat treatment at 600° C. for 60 sec was applied in an oxygen gas flow.

Then, an upper ruthenium electrode 6 was deposited over the entire surface by bubbling CVD [FIG. 1(d)]. $Ru(EtCp)_2$ was used as the starting material and Ar was used as a carrier gas. For promoting the decomposition of the starting material, an $O_2$ gas at 1% concentration relative to Ar as the carrier gas was mixed just before the film deposition chamber. The film was not oxidized but an Ru metal film was deposited. The deposition temperature was 230° C., the pressure was 0.5 Torr and the film thickness was about 50 nm. Since formation of the ruthenium film by the bubbling can provide preferred coverage under the deposition conditions as described above, a uniform upper ruthenium electrode can be formed at the bottom and on the side wall of the hole.

A fine concave type capacitor having a ruthenium electrode can be attained by using Embodiment 1.

The method of forming the lower ruthenium electrode is not restricted to the low-pressure and long-throw sputtering described above but similar effects can be obtained also by using collimated sputtering or ionized sputtering.

The material of the oxide dielectric film is not restricted only to tantalum pentoxide described above but strontium titanate, barium strontium titanate, lead titanate zirconate and bismuth type layerous ferroelectric material can be used.

Further, the starting material for the chemical vapor deposition is not restricted only to $Ru(EtCp)_2$ [Ru $(C_2H_5C_5H_4)_2$: bis (ethylcyclopentadienyl) ruthenium], but similar effect can be obtained by using liquid organic ruthenium compounds. Further, the starting material conveying method is not restricted only to the bubbling but similar effects can also be obtained by using the liquid conveyance.

Conditions for forming the upper ruthenium electrode are not restricted to those described above but may be any other condition capable of depositing the ruthenium film also on the side wall of the hole. Specifically, it is necessary that the pressure exceeds 0.1 Torr and does not exceed 10 Torr. It is preferred that the formation temperature exceeds 200° C. but does not exceed 230° C. and it is necessary that the temperature exceeds 200° C. but does not exceed 350° C. Further, it is necessary that the oxygen ratio exceeds 0.1% but not does not exceed 25%. However, since the critical conditions for the formation temperature, oxygen ratio and pressure vary depending on the apparatus structure, they can not be decided generally.

Embodiment 2

Figure 2:
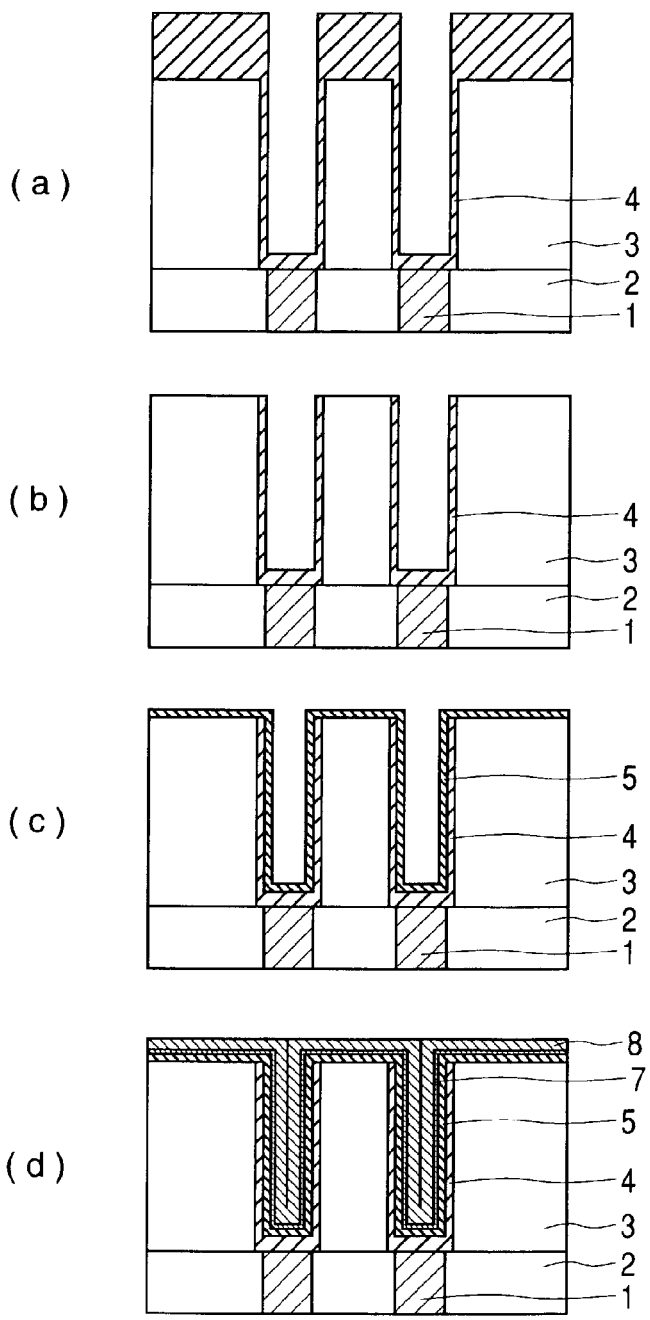
FIG. 2 is a vertical cross sectional view for explaining Embodiment 2 according to this invention.

Embodiment 2 according to this invention is to be described with reference to FIG. 2. In this embodiment, a lower ruthenium electrode is formed by low-pressure and long-throw sputtering, forming a ruthenium seed layer by chemical vapor deposition of conveying the starting material and then an upper ruthenium electrode is formed by chemical vapor deposition of conveying a starting material dissolved in a solvent.

At first, a capacitor portion interlayer insulating film 3 of 700 nm thickness comprising $SiO_2$ was deposited on plugs 1 comprising titanium nitride and a plug portion interlayer insulating film 2 comprising $SiO_2$ by plasma CVD using a mono-silane gas as the starting material.

Then, a resist was coated and developed by well-known photolithography, and a capacitor portion interlayer insulating film 3 was fabricated as far as the surface of the plugs 1 by dry etching using the resist as a mask. The fabrication was made such that the opening has an elliptic cylindrical shape, and the opening is utilized as the lower electrode. After removing the resist, a lower ruthenium electrode 4 by the low-pressure and long-throw sputtering was deposited over the entire surface [FIG. 2(a)]. The deposition conditions for the lower ruthenium electrode included a temperature of 300° C., 2 kW of incident power and 0.1 Pa of pressure. Further, the distance between the target and the substrate was set to 170 mm. The film thickness was about 20 nm on the side wall and about 40 nm at the hole bottom and about 300 nm on the planar portion of the upper surface of the deep hole.

Then, for electrically separating adjacent capacitors, the ruthenium film deposited on the upper surface of the interlayer insulating film was removed by chemical mechanical polishing or sputtering etching [FIG. 2(b)]. In this process, it is desirable to previously form a stopper such as a silicon nitride film to the surface portion of the capacitor portion interlayer insulating film upon removing the ruthenium film. The stopper may be removed after the removal of the ruthenium film or may be left as it is. Further, it is preferred to bury a silicon oxide film or resist to the concave portion for preventing particles from dropping to the concave portion of the capacitor portion interlayer insulating film upon removal of the ruthenium film. It is necessary that the silicon oxide film or the resist be removed before forming the lower electrode.

Then, for preventing the lower ruthenium electrode from deformation by the post-annealing, it is preferred that the lower ruthenium electrode is sintered by a heat treatment. Specifically, a heat treatment at 700° C. for one min may be conducted in an inert atmosphere, for example, in argon. It is preferred that the heat treatment temperature is higher than the heat treatment temperature for crystallization of the dielectric oxide film.

Then, an oxide dielectric material 5 comprising a tantalum pentoxide film was deposited by chemical vapor deposition [FIG. 2(c)]. $Ta(OC_2H_5)_5$ (pentaethoxy tantalum) used as a Ta starting material was conveyed by bubbling by using Ar as a carrier gas, and mixed with oxygen just before the film deposition chamber. The deposition temperature was at 400° C., the pressure was at 0.5 Torr and the film thickness was 10 nm. After depositing the tantalum pentoxide film, a heat treatment was conducted for promoting crystallization of the tantalum pentoxide film. At first, after conducting a heat treatment for crystallization in a nitrogen gas flow at 650° C. for 120 sec, an oxidizing heat treatment at 600° C. for 60 sec was applied in an oxygen gas flow.

After the heat treatment for the tantalum pentoxide film, a ruthenium seed layer 7 was deposited over the entire surface by bubbling CVD. $Ru(EtCp)_2$ was used as the starting material and Ar was used as a carrier gas. For promoting the decomposition of the starting material, an $O_2$ gas at 1% concentration relative to the carrier gas Ar was mixed before the film deposition chamber. The film was not oxidized but an Ru metal film is deposited. The deposition temperature is 230° C., the pressure was 0.5 Torr and the film thickness was about 2 nm. Since the formation of the ruthenium film by the bubbling can provide satisfactory coverage under the deposition conditions, a uniform ruthenium seed layer can be formed at the bottom and on the side wall of the hole.

Then, an upper ruthenium electrode 8 was deposited on the entire surface by using a solvent conveyance CVD method [FIG. 2(d)]. A starting material $Ru(EtCp)_2$ was dissolved into a THF solvent to a concentration of 0.1 mol/liter, and the amount of supply was controlled to 0.5 sccm by a liquid mass flow controller. Further, the starting material was vaporized at 150° C. by using a vaporizer before the film deposition chamber. For promoting the decomposition of the starting material, an $O_2$ gas at 10% concentration relative to Ar was mixed just before the deposition chamber. The film was not oxidized but an Ru metal was deposited. The deposition temperature was 300° C., the pressure was 5 Torr and the film thickness was about 50 nm. Since the formation of the ruthenium film by the solvent conveyance method can provide preferred coverage on the ruthenium seed layer under the deposition conditions described above, a uniform upper ruthenium electrode can be formed at the bottom and on the side wall of the hole.

A fine concave type capacitor having a ruthenium electrode can be attained by using Embodiment 2.

The method of forming the lower ruthenium electrode is not restricted to the low-pressure and long-throw sputtering described above but similar effects can be obtained also by using a collimated sputtering or ionized sputtering.

The material of the oxide dielectric film is not restricted only to tantalum pentoxide described above but strontium titanate, barium strontium titanate, lead titanate zirconate and bismuth type layerous ferroelectric material can be used.

Further, the starting material for the chemical vapor deposition using the bubbling for forming the ruthenium seed layer is not restricted to $Ru(EtCp)_2$ [$Ru(C_2H_5C_5H_4)_2$: bis (ethylcyclopentadienyl) ruthenium] but similar effects can also be obtained by using a liquid organic ruthenium compounds. Further, the starting material conveyance method is not restricted to the bubbling but similar effects can be obtained also by using a liquid conveyance method.

Further, the starting material for the chemical vapor deposition using the solvent conveyance method for forming the upper ruthenium electrode is not restricted to $Ru(EtCp)_2$ [$Ru (C_2H_5C_5H_4)_2$: bis (ethylcyclopentadienyl) ruthenium], but similar effects can be obtained also by using organic Ru compound starting materials $Ru(Cp)_2[Ru(C_5H_5)_2$: bis(cyclopentadienyl) ruthenium], $Ru(MeCp)_2[Ru (CH_3C_5H_4)_2$: bis(methylcyclopentadienyl)ruthenium], or $Ru (DPM)_3[Ru \{(CH_3)_3CCOCH_2COC(CH_3)_3\}_3$: ruthenium dipivaloyl methane]. Further, in the solvent conveyance method, the solvent for dissolving the starting material is not restricted to THF but similar effects can be obtained by using ether compounds capable of dissolving the starting material.

The condition for forming the ruthenium seed layer is not restricted to those described above but they may be any other conditions depositing the ruthenium film also on the side wall of the hole. Specifically, it is necessary that the pressure exceeds 0.1 Torr but does not exceed 10 Torr. It is preferred that the formation temperature exceeds 200° C. but does not exceed 230° C., and it is necessary that the temperature exceeds 200° C. but does not exceed 350° C. Further it is necessary that the oxygen ratio exceeds 0.1% but does not exceed 25%. However, since the critical conditions for the formation temperature, the oxygen ratio and the pressure vary depending on the structure of the apparatus, they can not be decided generally.

The conditions for forming the upper ruthenium electrode are not restricted to those described above but they may be any other conditions depositing the ruthenium film also on the side wall of the hole. Specifically, it is necessary that the pressure exceeds 0.1 Torr but does not exceed 10 Torr. It is necessary that the formation temperature exceeds 250° C. but does not exceed 450° C. Further, it is necessary that the oxygen ratio exceeds 1% but does not exceed 30%. However, since the critical conditions for the formation temperature, the oxygen ratio and the pressure vary depending on the structure of the apparatus, they can not be decided generally.

Figure 5:
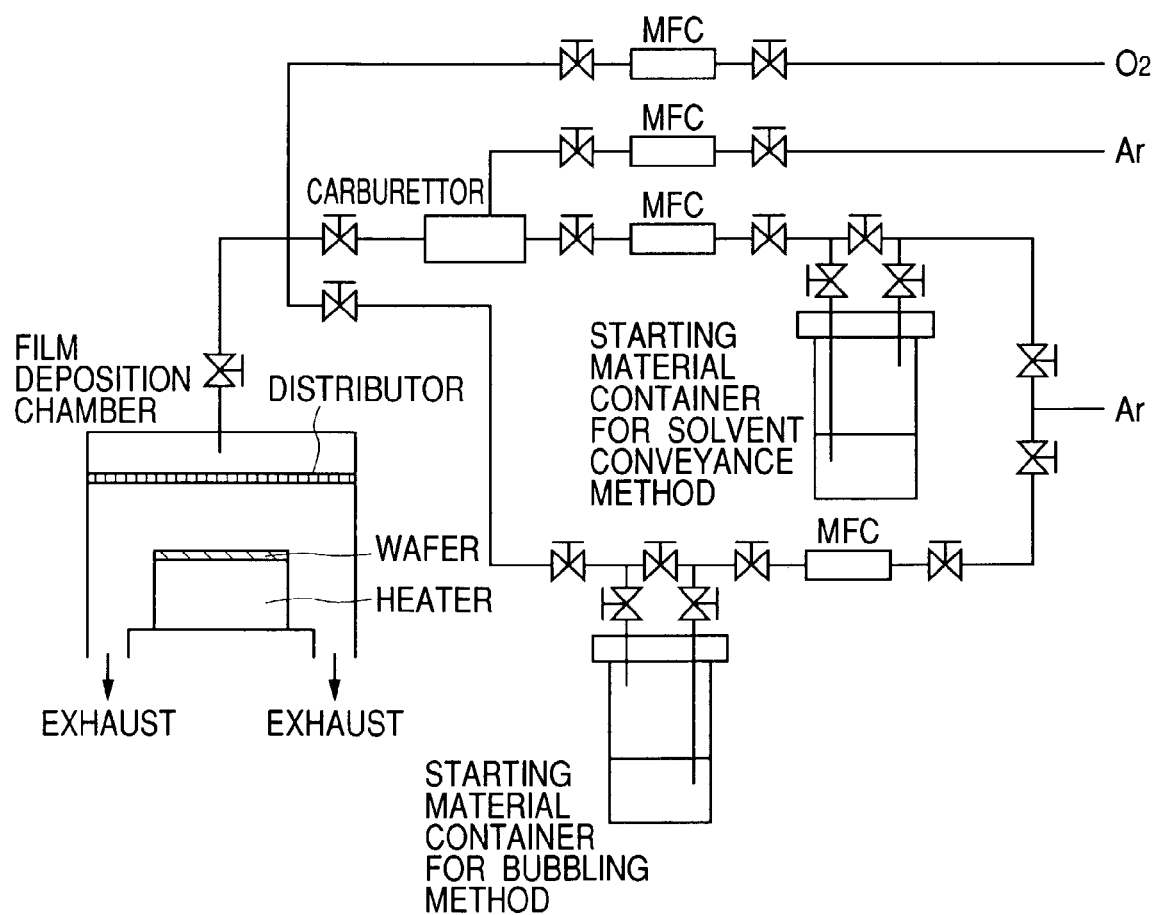
FIG. 5 is a constitutional view for an apparatus for practicing this invention.
Figure 7:
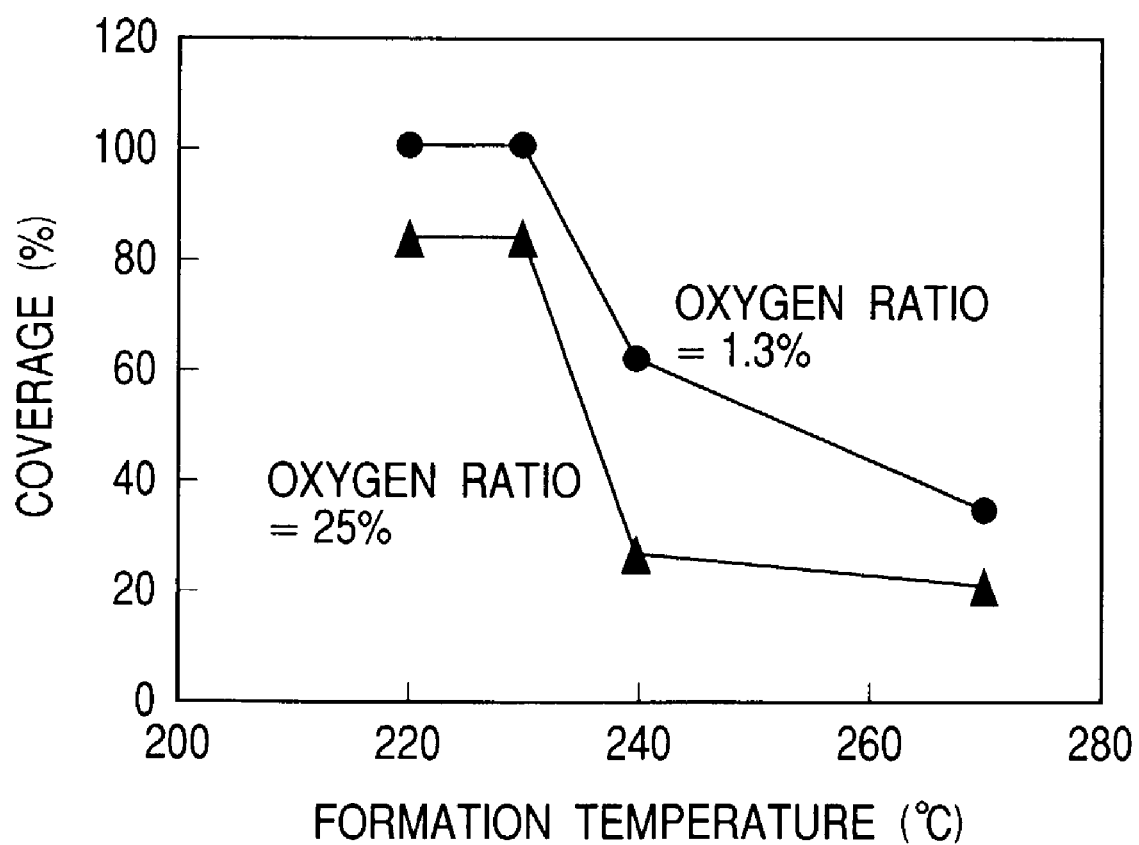
FIG. 7 is a graph illustrating the dependence of the Ru film coverage on the formation temperature and the oxygen ratio by the liquid bubbling method.
Figure 8:
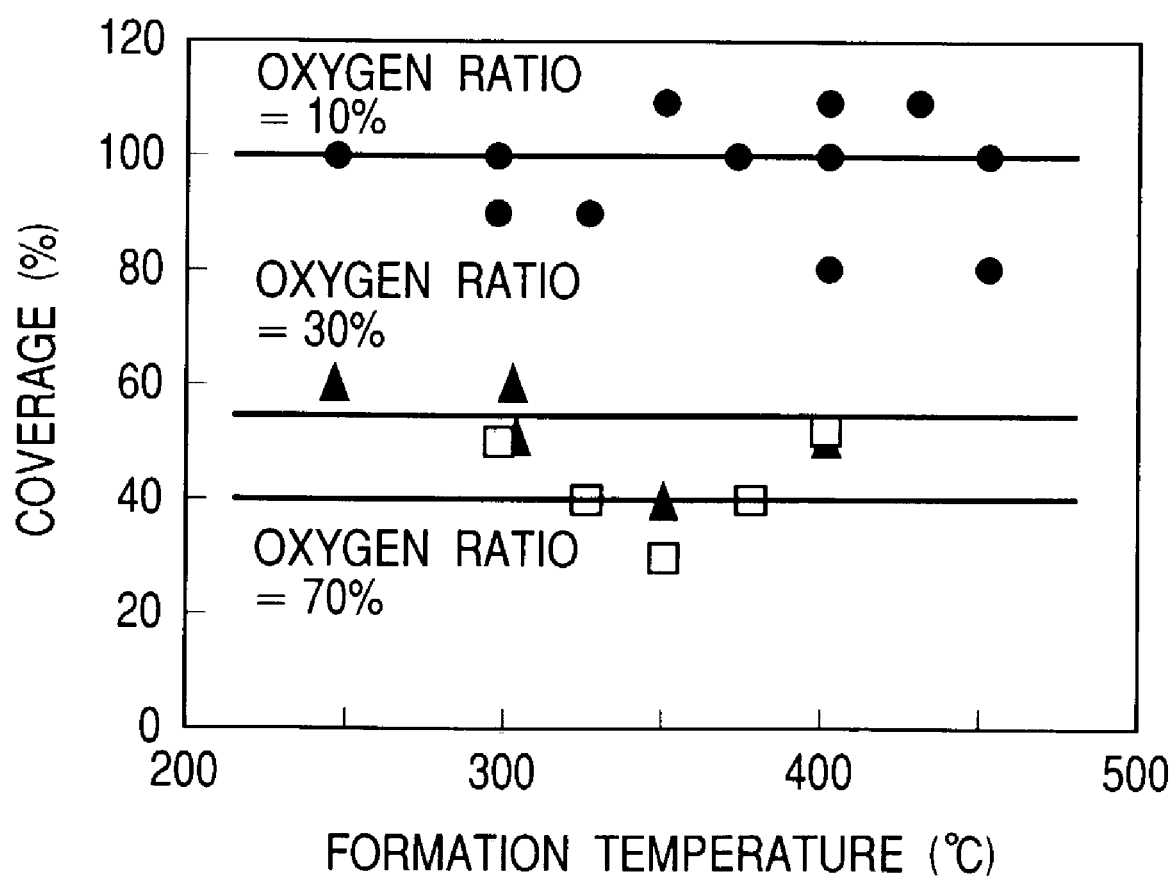
FIG. 8 is a graph illustrating the dependence of the Ru film coverage on the formation temperature and the oxygen ratio by the solvent conveyance method.
Figure 9:
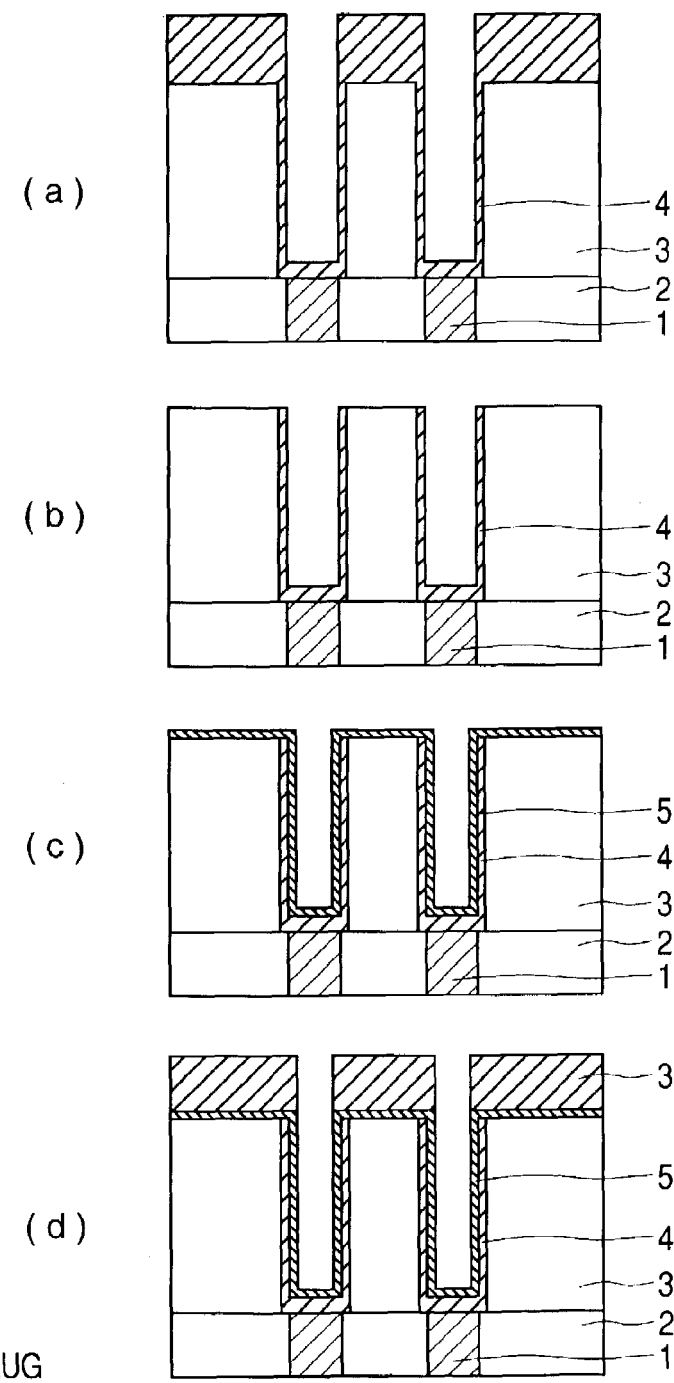
FIG. 9 is a vertical cross sectional view for the steps of explaining an example of an existent method.

In this embodiment, the ruthenium seed layer by the bubbling and the upper ruthenium electrode by the solvent conveyance method were formed in respective apparatus. However, since the seed layer and the electrode can be formed continuously by using an apparatus as shown in FIG. 5 having two conveyance systems for the bubbling and the solvent conveyance method is used, the performance of the seed layer can be utilized to the utmost degree. Further, the conveyance system for use in the liquid conveyance method may also be used instead of the conveyance system for use in the bubbling.

Embodiment 3

Embodiment 3 of this invention is to be described with reference to FIG. 3. This embodiment is adapted for forming a ruthenium seed layer by low-pressure and long-throw sputtering, and then forming a lower ruthenium electrode by chemical vapor deposition of conveying the starting material dissolved in a solvent, forming an upper ruthenium electrode by chemical vapor deposition of conveying the starting material.

At first, on plugs 1 comprising titanium nitride and a plug portion interlayer insulating film 2 comprising $SiO_2$, a capacitor portion interlayer insulating film 3 of 700 nm thickness comprising $SiO_2$ was deposited by a plasma CVD method using a mono-silane gas as a starting material.

Subsequently, resist was coated and developed by well-known photolithography and the capacitor portion interlayer insulating film 3 was fabricated as far as the surf ace of the plugs 1 by dry etching using the resist as a mask. Fabrication was conducted such that the opening had an elliptical cylindrical shape and the opening was utilized for the lower electrode.

After removing the resist, a ruthenium seed layer 9 was deposited over the entire surf ace by low-pressure and long-throw sputtering. The deposition conditions for the ruthenium seed layer included a temperature of 300° C., an incident power of 2 kW and a pressure of 0.1 Pa. Further, the distance between the target and the substrate was set to 170 mm. The film thickness was about 1 nm on the side wall, about 2 nm at the hole bottom and about 15 nm at the planar portion of the upper surface of deep hole.

Subsequently, a lower ruthenium electrode 10 was deposited over the entire surface by a solvent conveyance CVD method [FIG. 3(*a*)]. A starting material $Ru(EtCp)_2$ was dissolved in a THF solvent such that the concentration was 0.1 mol/liter, and the amount of supply was controlled to 0.5 sccm by a liquid mass flow controller. Further, the starting material was evaporated at 150° C. by using an evaporator. An $O_2$ gas at 10% concentration relative to Ar was mixed just before the film deposition chamber for promoting decomposition of the starting material. The film was not oxidized but an Ru metal film was deposited. The deposition temperature was 300° C., the pressure was 5 Torr and the film thickness was about 20 nm. Since formation of the ruthenium film by the solvent conveyance method can provide good coverage under the deposition conditions described above on the ruthenium seed layer, a uniform lower ruthenium electrode can be formed at the bottom and the side wall of the hole. Further, since sputtering is used for the formation of the seed layer, adhesion with the underlying portion is high.

Figure 3:
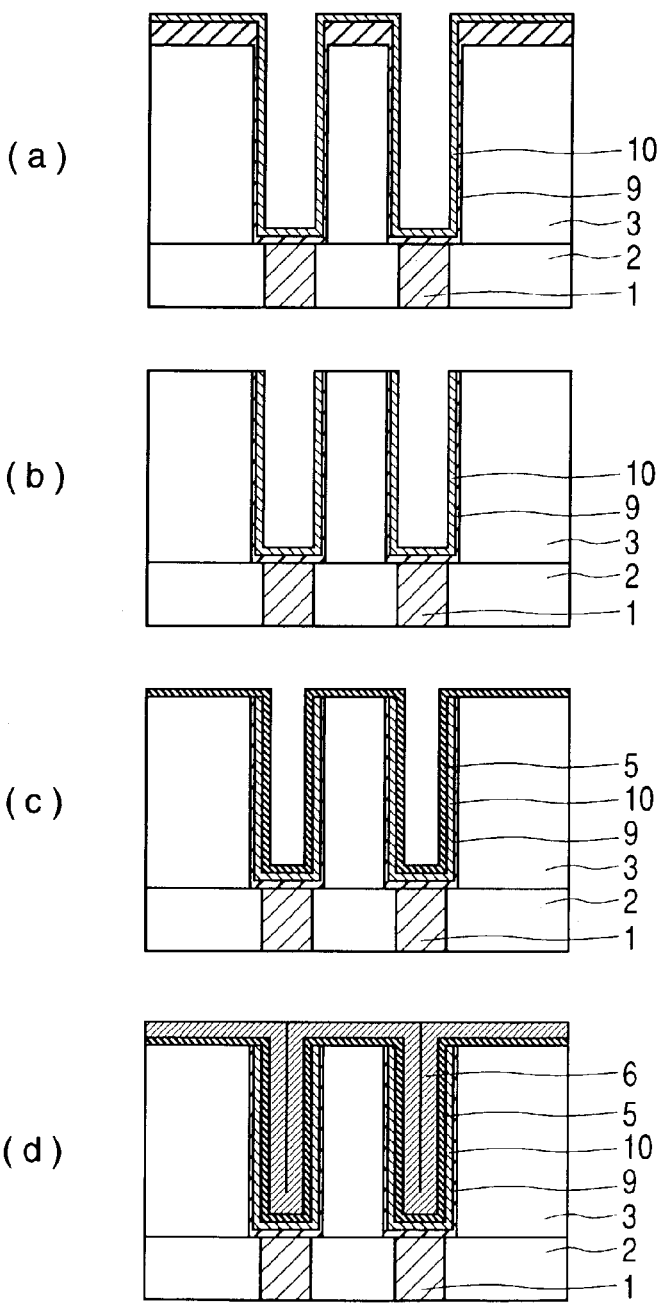
FIG. 3 is a vertical cross sectional view for explaining Embodiment 3 according to this invention.

Then, for electrically separating adjacent capacitors, the ruthenium film deposited on the upper surface of the interlayer insulating film was removed by chemical mechanical polishing or sputtering etching [FIG. 3(*b*)]. When the ruthenium film is removed, it is preferred to form a stopper such as a silicon nitride film on the surface of the capacitor portion interlayer insulating film in advance. The stopper may be removed after removing the ruthenium film or may be left as it is. Further, it is preferred to bury a silicon oxide film or a resist in the concave portion of the capacitor portion interlayer insulating film for preventing particles from dropping to the concave portion upon removal of the ruthenium film. The silicon oxide film or the resist has to be removed before forming the lower electrode.

In this process, it is preferred to sinter the lower ruthenium electrode by a heat treatment for preventing lower ruthenium electrode from deformation by post-annealing. Specifically, a heat treatment at 700° C. for one min may be applied in an inert atmosphere, for example, in argon. It is desired that the temperature for the heat treatment is higher than for the heat treatment temperature for crystallization of the dielectric oxide film.

Subsequently, an oxide dielectric material 5 comprising a tantalum pentoxide film was deposited by chemical vapor deposition [FIG. 3(*c*)]. $Ta(OC_2H_5)_5$ (pentaethoxy tantalum) as the Ta starting material was conveyed by bubbling using Ar as a carrier gas, and mixed with oxygen just before the film deposition chamber. The deposition temperature was 400° C., the pressure was 0.5 Torr and the film thickness was 10 nm. After depositing the tantalum pentoxide film, a heat treatment was applied for promoting the crystallization of the tantalum pentoxide film. At first, after applying a crystallizing heat treatment at 650° C. for 120 sec in a nitrogen gas flow, an oxidizing heat treatment was conducted at 600° C. for 60 sec in an oxygen gas flow.

Then, an upper ruthenium electrode 6 was deposited on the entire surface by a bubbling CVD method [FIG. 3(*d*)]. A $Ru(EtCp)_2$ was used as a starting material and Ar was used as a carrier gas. For promoting the decomposition of the starting material, an $O_2$ gas at 1% concentration relative to Ar of the carrier gas was mixed just before the film deposition chamber. The film was not oxidized but an Ru metal was deposited. The deposition temperature was 230° C., the pressure was 0.5 Torr and the film thickness was about 50 nm. Since the formation of the ruthenium film by the bubbling can provide good coverage under the deposition conditions, a uniform upper ruthenium electrode can be formed at the bottom and on the side wall of the hole.

By using Embodiment 3, a fine concave type capacitor having a ruthenium electrode can be attained.

The method of forming the ruthenium seed layer is not restricted to the low-pressure and long-throw sputtering described above but similar effects can be obtained also by using a collimated sputtering method or an ionized sputtering method.

The material of the oxide dielectric film is not restricted to tantalum pentoxide described above, but strontium titanate, barium strontium titanate, lead titanate zirconate and bismuth type layerous ferroelectric material can be used.

Further, the starting material for the chemical vapor deposition using the solvent conveyance method for forming the lower ruthenium electrode is not restricted to $Ru(EtCp)_2$ [$Ru(C_2H_5C_5H_4)_2$: bis(ethylcyclopentadienyl) ruthenium], but similar effects can be obtained also by using organic Ru compound starting materials $Ru(Cp)_2$[$Ru(C_5H_5)_2$: bis (cyclopentadienyl) ruthenium], $Ru(MeCp)_2$ [$Ru(CH_3C_5H_4)_2$: bis(methylcyclopentadienyl)ruthenium], or $Ru(DPM)_3$[$Ru\{(CH_3)_3CCOCH_2COC(CH_3)_3\}_3$: ruthenium dipivaloyl methane].

Further, in the solvent conveyance method, the solvent dissolving the starting material is not restricted to THF but similar effects can be obtained by using etheric compounds capable of dissolving the starting material. It will be apparent that the lower ruthenium electrode may be formed by using the bubbling or liquid conveyance method.

Further, the starting material in the chemical vapor deposition using the bubbling for forming the upper ruthenium electrode, is not restricted to $Ru(EtCp)_2$ [$Ru(C_2H_5C_5H_4)_2$: bis (ethylcyclopentadienyl) ruthenium] but similar effects can be obtained also by using liquid organic ruthenium compounds. Further, the conveyance method for the starting material is not restricted to the bubbling but similar effects can be obtained also by using a liquid conveyance method.

The conditions for forming the lower ruthenium electrode is not restricted to those described above but they may be any other conditions depositing the ruthenium film also on the side wall of the hole. Specifically, it is necessary that the pressure exceeds 0.1 Torr but does not exceed 10 Torr. It is necessary that the formation temperature exceeds 250° C. but does not exceed 450° C. Further it is necessary that the oxygen ratio exceeds 1% but does not exceed 30%. However, since the critical conditions for the formation temperature, the oxygen ratio and the pressure vary depending on the structure of the apparatus, they can not be decided generally.

The conditions for forming the upper ruthenium electrode are not restricted to those described above but they may be any conditions depositing the ruthenium film also on the side wall of the hole. Specifically, it is necessary that the pressure exceeds 0.1 Torr but does not exceed 10 Torr. It is desirable that the formation temperature exceeds 200° C. but does not exceed 230° C. and it is necessary that the temperature exceeds 200° C. but does not exceed 350° C. Further, it is necessary that the oxygen ratio exceeds 0.1% but does not exceed 25%. However, since the critical conditions for the formation temperature, the oxygen ratio and the pressure vary depending on the structure of the apparatus, they can not be decided generally.

Embodiment 4

Embodiment 4 is to be described with reference to FIG. 4. This embodiment is adapted for forming a ruthenium seed layer by low-pressure and long-throw sputtering, then forming a lower ruthenium electrode by chemical vapor deposition of conveying the starting material dissolved in a solvent, forming a ruthenium seed layer by chemical vapor deposition of conveying the starting material and then forming an upper ruthenium electrode by chemical vapor deposition of conveying the starting material dissolved in a solvent.

At first, on plugs 1 comprising titanium nitride and a plug portion interlayer insulating film 2 comprising $SiO_2$, a capacitor portion interlayer insulating film 3 of 700 nm thickness comprising $SiO_2$ was deposited by a plasma CVD method using a mono-silane gas as a starting material.

Subsequently, resist was coated and developed by well-known photolithography and the capacitor portion interlayer insulating film 3 was fabricated as far as the surface of the plugs 1 by dry etching using the resist as a mask. Fabrication was conducted such that the opening had an elliptical cylindrical shape and the opening was utilized for the lower electrode.

After removing the resist, a ruthenium seed layer 9 was deposited over the entire surface by low-pressure and long-throw sputtering. The deposition conditions for the ruthenium seed layer included a temperature of 300° C., an incident power of 2 kW and a pressure of 0.1 Pa. Further, the distance between the target and the substrate was set to 170 mm. The film thickness was about 1 nm on the side wall, about 2 nm at the hole bottom and about 15 nm at the planar portion of the upper surface.

Subsequently, a lower ruthenium electrode 10 was deposited over the entire surface by a solvent conveyance CVD method [FIG. 4(a)]. Starting material $Ru(EtCp)_2$ was dissolved in a THF solvent such that the concentration was 0.1 mol/liter, and the amount of supply was controlled to 0.5 sccm by a liquid mass flow controller. Further, the material was evaporized at 150° C. by using a vaporizer or before a film deposition chamber. An $O_2$ gas at 10% concentration relative to Ar was mixed just before the film deposition chamber for promoting decomposition of the starting material. The film was not oxidized but an Ru metal film was deposited. The deposition temperature was 300° C., the pressure was 5 Torr and the film thickness was about 20 nm. Since formation of the ruthenium film by the solvent conveyance method can provide good coverage under the deposition conditions described above on the ruthenium seed layer, a uniform lower ruthenium electrode can be formed at the bottom and the side wall of the hole. Further, since the sputtering is used for the formation of the seed layer, adhesion with the underlying portion is high.

Then, for electrically separating adjacent capacitors, the ruthenium film deposited on the upper surface of the interlayer insulating film was removed by chemical mechanical polishing or sputtering etching [FIG. 4(b)]. When the ruthenium film is removed, it is preferred to form a stopper such as a silicon nitride film on the surface of the capacitor portion interlayer insulating film in advance. The stopper may be removed after removing the ruthenium film or may be left as it is. Further, it is preferred to bury a silicon oxide film or a resist in the concave portion of the capacitor portion interlayer insulating film for preventing particles from dropping to the concave portion upon removal of the ruthenium film. The silicon oxide film or the resist has to be removed before forming the lower electrode.

In this process, it is preferred to sinter the lower ruthenium electrode by a heat treatment for preventing the lower ruthenium electrode from deformation by post-annealing. Specifically, a heat treatment at 700° C. for one min may be applied in an inert atmosphere, for example, in argon. It is desired that the temperature for the heat treatment is higher than the heat treatment temperature for crystallization of the dielectric oxide film.

Subsequently, an oxide dielectric material 5 comprising a tantalum pentoxide film was deposited by chemical vapor deposition [FIG. 4(c)]. $Ta(OC_2H_5)_5$ (pentaethoxy tantalum) as the Ta starting material was conveyed by bubbling using Ar as a carrier gas, and mixed with oxygen just before the film deposition chamber. The deposition temperature was 400° C., the pressure was 0.5 Torr and the film thickness was 10 nm. After depositing the tantalum pentoxide film, a heat treatment was applied for promoting the crystallization of the tantalum pentoxide film. At first, after applying crystallizing heat treatment at 650° C. for 120 sec in an nitrogen gas flow, an oxidizing heat treatment was conducted at 600° C. for 60 sec in an oxygen gas flow.

After heat treatment for the tantalum oxide film, a ruthenium seed layer 7 by a bubbling CVD method was deposited over the entire surface. $Ru(EtCp)_2$ was used as the starting material and Ar was used as the carrier gas. An $O_2$ gas at 1% concentration relative to Ar of the carrier gas was mixed just before the film deposition chamber. The film was not oxidized but an Ru metal film was deposited. The deposition temperature was 230° C., the pressure was 0.5 Torr and the film thickness was about 2 nm. Since formation of the ruthenium film by the bubbling can provide good coverage under the deposition conditions described above, a uniform ruthenium seed layer can be formed at the bottom and on the side wall of the hole.

Subsequently, an upper ruthenium electrode 8 was deposited over the entire surface by the solvent conveyance CVD method [FIG. 4(d)]. The starting material $Ru(EtCp)_2$ was dissolved in THF solvent such that the concentration was 0.1 mol/liter and the amount of supply was controlled to 0.5 sccm by a liquid mass flow controller. Further, it was vaporized at 150° C. by using a vaporizer before the film deposition chamber. An $O_2$ gas at 10% concentration relative to Ar was mixed just before the film deposition chamber for promoting the decomposition of the starting material. The film was not oxidized but an Ru metal film was deposited. The deposition temperature was 300° C., the pressure was 5 Torr and the film thickness of about 50 nm. Since the formation of the ruthenium film by the solvent conveyance method can provide good coverage under the deposition conditions described above on the ruthenium seed layer, a uniform upper ruthenium electrode can be formed at the bottom and on the side wall of the hole.

By using Embodiment 4, a fine concave type capacitor having a ruthenium electrode can be attained.

The method of forming the ruthenium seed layer before forming the lower ruthenium electrode is not restricted to the low-pressure and long-throw sputtering described above but similar effects can be obtained also by using a collimated sputtering method or an ionized sputtering method.

The material of the oxide dielectric film is not restricted to tantalum pentoxide described above, but strontium titanate, barium strontium titanate, lead titanate zirconate and bismuth type layerous ferroelectric material can be used.

Further, the starting material for the chemical vapor deposition using the solvent conveyance method for forming the lower ruthenium electrode and the upper ruthenium electrode is not restricted to $Ru(EtCp)_2[Ru(C_2H_5C_5H_4)_2$: bis (ethylcyclopentadienyl) ruthenium], but similar effects can also be obtained by using organic compound starting material of for Ru such as $Ru(Cp)_2[Ru(C_5H_5)_2$: bis(cyclopentadienyl)ruthenium] or $Ru(MeCp)_2[Ru(CH_3C_5H_4)_2$: bis(m-ethylcyclopentadienyl)ruthenium], or $Ru(DPM)_3[Ru\{(CH_3)_3\ CCOCH_2COC(CH_3)_3\}_3$: ruthenium dipivaloyl methane]. Further, in the solvent conveyance method, the solvent dissolving the starting material is not restricted to THF but similar effects can be obtained by using ether compounds capable of dissolving the starting material.

Further, the starting material in the chemical vapor deposition using the bubbling for forming the ruthenium seed layer before forming the upper electrode is not restricted to $Ru(EtCp)_2[Ru\ (C_2H_5C_5H_4)_2$: bis (ethylcyclopentadienyl) ruthenium] but similar effects can be obtained also by using liquid ruthenium organic compounds. Further, the starting material conveyance method, is not restricted to the bubbling but similar effects can also be obtained by using the liquid convenience method.

The conditions for forming the lower ruthenium electrode and upper ruthenium electrode are not restricted to those described above but they may be any other conditions depositing the ruthenium film also on the side wall of the hole. Specifically, it is necessary that the pressure exceeds 0.1 Torr but does not exceed 10 Torr. It is preferred that the formation temperature exceeds 250° C. but does not exceed 450° C. Further, it is necessary that the oxygen ratio exceeds 1% but does not exceed 30%. However, since the critical conditions for the formation temperature, the oxygen ratio and the pressure vary depending on the structure of the apparatus, they can not be decided generally.

The condition for forming the ruthenium seed layer before forming the upper electrode is not restricted to those described above but they may be any other conditions depositing the ruthenium film also on the side wall of the hole. Specifically, it is necessary that the pressure exceeds 0.1 Torr but does not exceed 10 Torr. It is preferred that the formation temperature exceeds 200° C. but does not exceed 230° C. and it is necessary that the temperature exceeds 200° C. but does not exceed 350° C. Further, it is necessary that the oxygen ratio exceeds 0.1% but does not exceed 25%. However, since the critical conditions for the formation temperature, the oxygen ratio and the pressure vary depending on the structure of the apparatus, they can not be decided generally.

In this embodiment, the ruthenium seed layer by the bubbling and the upper ruthenium electrode by the solvent conveyance method were formed in respective apparatus. However, since the seed layer and the electrode can be formed continuously by using an apparatus as shown in FIG. 5 having two conveyance systems for the bubbling and the solvent conveyance method is used, the performance of the seed layer can be utilized to the utmost degree. Further, the conveyance system for use in the liquid conveyance method may also be used instead of the conveyance system for use in the bubbling.

Embodiment 5

Embodiment 5 of this invention is to be described with reference to FIG. 6. In this embodiment, a capacitance memory device was manufactured by using a method of forming a lower ruthenium electrode by the low-pressure and long-throw sputtering and forming an upper ruthenium electrode by chemical vapor deposition of conveying the starting material as explained for Embodiment 1.

Device isolation 12 by thermal oxidation and a diffused layer 13 by ion implantation were formed to an Si substrate 11, on which word lines 14 and 15 comprising a lamination of Poly-Si and $WSi_2$ were formed.

Subsequently, bit lines 18 and 19 comprising a lamination of Poly-Si and $WSi_2$ were formed on a barrier layer 17 comprising $Si_3N_4$.

Further, a first plug 16 and a second plug 20 comprising Poly-Si and a barrier 21 comprising TiN were formed to a plug portion interlayer insulating film 22 comprising $SiO_2$ and an interlayer insulating film comprising $Si_3N_4$. The diffused layer 13 of a transistor and a lower electrode 25 of a capacitor are electrically connected by way of the lamination plugs.

Then, by using the method explained in Embodiment 1. a capacitor portion interlayer insulating film 24 comprising $SiO_2$, a lower electrode 25 comprising Ru by the low-pressure and long-throw sputtering and a capacitance insulating film 26 comprising $Ta_2O_5$ were formed. Then, an upper electrode 27 comprising Ru was formed by bubbling.

Then, a wiring portion interlayer insulating film 28 comprising $SiO_2$ and a second wiring layer 29 comprising W were formed above the capacitor.

When the memory operation of the capacitance memory device was confirmed, it was confirmed that desired characteristics were obtained.

In this case, the capacitance memory device was manufactured by using the method of forming the lower ruthenium electrode by the low-pressure and long-throw sputtering and forming the upper ruthenium electrode by chemical vapor deposition of conveying the starting material as explained in Embodiment 1. However, this is not restricted but desired characteristics of memory operation can be obtained also by manufacturing a capacitance memory device by using, for example, a method of forming a lower ruthenium electrode by the low-pressure sputtering and forming the upper ruthenium seed layer by the chemical vapor deposition of conveying the starting material and then forming the upper ruthenium electrode by the chemical vapor deposition of conveying the starting material dissolved in the solvent as explained in Embodiment 2, a method of forming a ruthenium seed layer by the low-pressure and long-throw sputtering, then forming a lower ruthenium electrode by the chemical vapor deposition of conveying the starting material dissolved in a solvent and forming an upper ruthenium electrode by the chemical vapor deposition of conveying the starting material as explained in Embodiment 3, and a method of forming a ruthenium seed layer by the low pressure and long-throw sputtering, then forming a lower ruthenium electrode by the chemical vapor deposition of conveying the starting material dissolved in the solvent, forming a ruthenium seed layer by chemical vapor deposition of conveying the starting material and then forming the upper ruthenium electrode by the chemical vapor deposition of conveying the starting material dissolved in the solvent as explained in Embodiment 4.

According to this invention, fine concave type capacitor having a ruthenium electrode can be attained. This can provide higher integration degree by refinement of semiconductor capacitance device/improvement in yield by step simplification and reduction of cost by saving of the number of steps.

What is claimed is:

1. A method of manufacturing a semiconductor device comprising:

a step of forming an interlayer insulating film on a semiconductor substrate;

a step of forming a concave type hole in the interlayer insulating film;

a step of forming a first ruthenium film on the inner surface of the hole and the upper surface of the interlayer insulating film by low-pressure and long-throw sputtering;

a step of removing the first ruthenium film formed on the interlayer insulating film to form a lower electrode in the hole;

a step of forming a dielectric film on the upper surface of the interlayer insulating film and on the lower electrode;

a step of forming a ruthenium seed layer on the dielectric film by chemical vapor deposition including conveying of a starting material of an organic ruthenium compound by a bubbling or liquid conveyance method; and a step of forming a second ruthenium film on the seed layer by chemical vapor deposition including conveying of a starting material of an organic ruthenium compound by a solvent conveyance method and forming an upper electrode of the ruthenium seed layer and the second ruthenium film.

2. A method of manufacturing a semiconductor device according to claim 1, wherein the chemical vapor deposition including conveying of the starting material of an organic ruthenium compound by the bubbling or liquid conveyance method is conducted in an atmosphere containing an oxidizing gas and the concentration of the oxidizing gas is within a range from 0.1% by volume or more and 25% by volume or less.

3. A method of manufacturing a semiconductor device according to claim 1, wherein the chemical vapor deposition including conveying of the starting material of an organic ruthenium compound by the solvent conveyance method is conducted in an atmosphere containing an oxidizing gas and the concentration of the oxidizing gas is within a range from 1% by volume or more and 30% by volume or less.

4. A method of manufacturing a semiconductor device according to claim 1, wherein the chemical vapor deposition including conveying of the starting material of an organic ruthenium compound by the bubbling or liquid conveyance method is conducted within a range with a pressure of atmosphere from 0.1 Torr or more and 10 Torr or less.

5. A method of manufacturing a semiconductor device according to claim 1, wherein the chemical vapor deposition including conveying of the starting material of an organic ruthenium compound by the solvent conveyance method is conducted within a range of the pressure of atmosphere from 0.1 Torr or more and 10 Torr or less.

6. A method of manufacturing a semiconductor device according to claim 1, wherein the chemical vapor deposition including conveying of the starting material of an organic ruthenium compound by the bubbling or liquid conveyance method is conducted under the condition of a temperature of 200° C. or higher and 350° C. or lower.

7. A method of manufacturing a semiconductor device according to claim 1, wherein the chemical vapor deposition including conveying of the starting material of an organic ruthenium compound by the solvent conveyance method is conducted under the condition of a temperature of 250° C. or higher and 450° C. or lower.

8. A method of manufacturing a semiconductor device according to claim 1, wherein at least one member selected from bis (ethylcyclopentadienyl) ruthenium, bis (cyclopentadienyl) ruthenium, bis (methylcyclopendienyl) ruthenium, and ruthenium dipivaloyl methane is used as the organic ruthenium compound.

9. A method of manufacturing a semiconductor device according to claim 1, wherein an etheric compound is used as the solvent used for the solvent conveyance method.

10. A method of manufacturing a semiconductor device according to claim 1, wherein at least one member selected from tantalum oxides, strontium titanate, barium strontium titanate, lead titanate zirconate, and bismuth type layerous ferroelectric body is used as the dielectric film.

11. A method of manufacturing a semiconductor device comprising:
a step of forming an interlayer insulating film on a semiconductor substrate;
a step of forming a concave type hole in the interlayer insulating film;
a step of forming a first ruthenium seed layer on the inner surface of the hole and the upper surface of the interlayer insulating film by low-pressure and long-throw sputtering;
a step of forming a first ruthenium film on the first ruthenium seed layer by chemical vapor deposition including conveying of a starting material of organic ruthenium compound by a solvent conveyance method;
a step of removing the first ruthenium seed layer and the first ruthenium film formed on the interlayer insulating film to form a lower electrode in the hole;
a step of forming a dielectric film on the upper surface of the interlayer insulating film and the lower electrode;
a step of forming a second ruthenium seed layer on the dielectric film by chemical vapor deposition including conveying of a starting material of an organic ruthenium compound by a bubbling or liquid conveyance method; and
a step of forming a second ruthenium film on the second ruthenium seed layer by chemical vapor deposition including conveying of a starting material of an organic ruthenium compound on the second ruthenium seed layer by a solvent conveyance method by forming an upper electrode of the ruthenium seed layer and the second ruthenium film.

12. A method of manufacturing a semiconductor device according to claim 11, wherein the chemical vapor deposition including conveying of the starting material of an organic ruthenium compound by the bubbling or liquid conveyance method is conducted in an atmosphere containing an oxidizing gas and the concentration of the oxidizing gas is within a range from 0.1% by volume or more and 25% by volume or less.

13. A method of manufacturing a semiconductor device according to claim 11, wherein the chemical vapor deposition including conveying of the starting material of an organic ruthenium compound by the solvent conveyance method is conducted in an atmosphere containing an oxidizing gas and the concentration of the oxidizing gas is within a range from 1% by volume or more and 30% by volume or less.

14. A method of manufacturing a semiconductor device according to claim 11, wherein the chemical vapor deposition including conveying of the starting material of an organic ruthenium compound by the solvent conveyance method is conducted within a range of the pressure of atmosphere from 0.1 Torr or more and 10 Torr or less.

15. A method of manufacturing a semiconductor device according to claim 11, wherein the chemical vapor deposition including conveying of the starting material of an organic ruthenium compound by the bubbling or liquid conveyance method is conducted within a range of the pressure of atmosphere from 0.1 Torr or more and 10 Torr or less.

16. A method of manufacturing a semiconductor device according to claim 11, wherein the chemical vapor deposition including conveying of the starting material of an organic ruthenium compound by the bubbling or liquid conveyance method is conducted under the condition of a temperature of 200° C. or higher and 350° C. or lower.

17. A method of manufacturing a semiconductor device according to claim 11, wherein the chemical vapor deposition including conveying of the starting material of an organic ruthenium compound by the solvent conveyance method is conducted under the condition of a temperature of 250° C. or higher and 450° C. or lower.

18. A method of manufacturing a semiconductor device according to claim 11, wherein at least one member selected from bis (ethylcyclopentadienyl) ruthenium, bis (cyclopentadienyl) ruthenium, bis (methylcyclopendienyl) ruthenium, and ruthenium dipivaloyl methane is used as the organic ruthenium compound.

19. A method of manufacturing a semiconductor device according to claim 11, wherein an etheric compound is used as the solvent used for the solvent conveyance method.

20. A method of manufacturing a semiconductor device according to claim 11, wherein at least one member selected from tantalum oxides, strontium titanate, barium strontium titanate, lead titanate zirconate and bismuth type layerous ferroelectric body is used as the dielectric film.

* * * * *